United States Patent [19]

Tasaka

[11] Patent Number: 5,231,046
[45] Date of Patent: Jul. 27, 1993

[54] METHOD FOR FABRICATING AN INTERCONNECTION PATTERN ON A BPSG-FILLED TRENCH ISOLATION STRUCTURE

[75] Inventor: Kazuhiro Tasaka, Tokyo, Japan
[73] Assignee: NEC Corporation, Tokyo, Japan
[21] Appl. No.: 879,302
[22] Filed: May 7, 1992
[30] Foreign Application Priority Data

May 8, 1991 [JP] Japan .................................. 3-102328

[51] Int. Cl.⁵ .......................................... H01L 21/76
[52] U.S. Cl. .................... 437/67; 437/228; 437/240; 437/63; 437/64; 148/DIG. 50
[58] Field of Search .................. 437/67, 240, 228, 63, 437/64, 187; 148/DIG. 50

[56] References Cited

U.S. PATENT DOCUMENTS 4,571,819  2/1986  Rogers et al. ............... 148/DIG. 50
4,740,480  4/1988  Ooka ..................................... 437/67

FOREIGN PATENT DOCUMENTS 0020530   2/1985  Japan ..................................... 437/67
0245249  12/1985  Japan ..................................... 437/67
0125443   5/1990  Japan ..................................... 427/67

Primary Examiner—Brian E. Hearn
Assistant Examiner—Trung Dang
Attorney, Agent, or Firm—Burns, Doane, Swecker & Mathis

[57] ABSTRACT

A semiconductor device is provided with an isolation region for isolating the semiconductor device from an adjacent semiconductor device provided commonly on a semiconductor substrate. The isolation region includes a groove extending to a predetermined depth of the substrate, a non-doped silicon oxide layer provided on a whole inner surface of the groove, and a BPSG (boro-phospho-silicate glass) layer filled in a remaining portion of the groove covered with the non-doped silicon oxide layer on the inner surface. An interconnection layer is provided on the isolating region selectively.

4 Claims, 5 Drawing Sheets

METHOD FOR FABRICATING AN INTERCONNECTION PATTERN ON A BPSG-FILLED TRENCH ISOLATION STRUCTURE

FIELD OF THE INVENTION

This invention relates to a semiconductor device and a method for fabricating the same, and more particularly to, a semiconductor device having a separating region for separating adjacent devices, and a fabricating method for the same.

BACKGROUND OF THE INVENTION

A plurality of semiconductor device (transistors) are integrated on a semiconductor substrate, and are separated by separating grooves filled with, for instance, BPSG (boro-phospho-silicate glass). The device includes a gate oxide layer grown on the substrate to insulate a gate from the substrate, a polycrystal layer grown on the gate oxide layer, and an interconnection pattern such as tungsten silicide provided on the polycrystal layers and selectively on the separating grooves.

In fabrication, first, the gate oxide layer, the polycrystal silicon layer and a first BPSG (boro-phospho-silicate glass) layer are successively grown on the silicon substrate. Then, a photo resist layer is formed on the first BPSG layer, and patterned to have a opening for the separating region. After that, the first BPSG layer, the polycrystal silicon layer and the gate oxide layer are etched with using the photo resist layer as a mask, so that a surface of the silicon substrate corresponding to the separating region is exposed.

Next, after removing the photo resist layer, the silicon substrate is etched with using the first BPSG layer as a mask to have grooves to be for the separating regions. Then, a second BPSG (boro-phospho-silicate glass) layer is formed on a whole surface of the fabricated silicon substrate by the CVD (chemical vapor deposition) method, and is reflowed by thermal treatment, so that the grooves are filled up thereby.

Next, the first and second BPSG layers are etched with using the polycrystal silicon layer as a stopper, so that the separating region is formed in the grooves by the remained second BPSG layer. Finally, the tungsten silicide pattern is formed on a surface of the structure as electrodes.

According to the conventional semiconductor device, however, there is a disadvantage in that the silicon substrate may be exposed at an inner surface of the grooves, when the BPSG layers are etched. That is, the second BPSG layer is etched to a level under the surface level of the gate oxide layer, because control of etching depth is not precisely carried out. Therefore, a short circuit may occur between the silicon substrate and the electrode, as the result, reliability of the semiconductor device is decreased to lower yield.

SUMMARY OF THE INVENTION

Accordingly, it is an object of the invention to provide a semiconductor device having a high reliability by avoiding the short circuit between the silicon substrate and the electrode.

It is another object of the invention to provide a method for fabricating a semiconductor device by which a semiconductor device having a high reliability can be fabricated.

According to the first feature of the invention, a semiconductor device includes:

a gate oxide layer grown on a semiconductor substrate, the gate oxide layer insulating a gate electrode from the substrate;

a polycrystal silicon layer grown on the gate oxide layer;

an isolation region for isolating the semiconductor device from a parallel connected adjacent semiconductor device provided commonly on the semiconductor substrate; and an interconnection layer of a predetermined pattern provided on the polycrystal silicon layer and selectively on the isolating region;

wherein the isolation region comprises a groove extending through the polycrystal silicon layer and the silicon oxide layer to a predetermined depth of the substrate, a first insulation layer provided substantially on a whole inner surface of the groove, and a second insulation layer filled in a remaining portion of the groove covered with the first insulation layer on the inner surface.

According to the second feature of the invention, a method for fabricating a semiconductor device includes the steps of:

forming a gate insulation film, a polycrystal silicon film and a fist insulation film successively on a semiconductor substrate;

etching the gate insulation film, the polycrystal silicon film and the first insulation film at a region under which a device separation region is to be provided;

etching the semiconductor substrate by use of the first insulation film as a mask, thereby providing a groove for the device separation region;

providing second and third insulation films to be filled into the groove;

etching the first to third insulation films by use of the polycrystal silicon film as a stopper to keep the second and third insulation films remained in the groove; and providing a metal interconnection on the polycrystal silicon film.

BRIEF DESCRIPTION OF THE DRAWINGS

The invention will be explained in more detail in conjunction with appended drawings wherein.

DESCRIPTION OF THE PREFERRED EMBODIMENTS

Before describing a semiconductor device in a preferred embodiment according to the invention, the conventional semiconductor device described before will be explained in accordance with a fabricating method shown in FIGS. 1A to 1D.

Figure 1A:
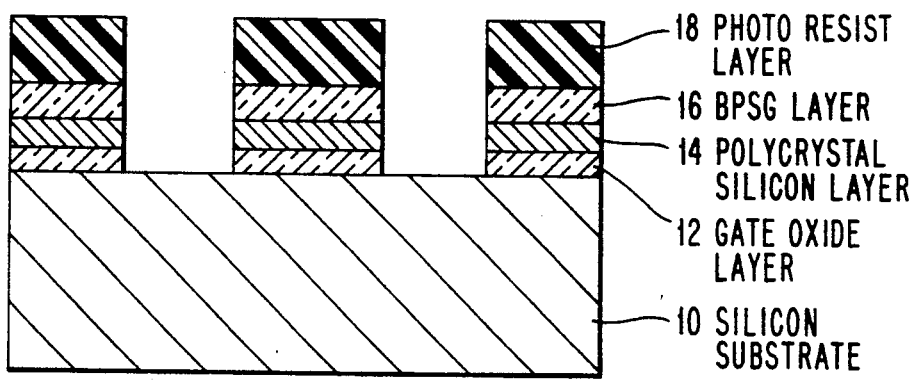
FIGS. 1A to 1D are schematic cross-sectional views showing a fabricating method of a conventional semiconductor device.

First, a gate oxide layer 12, a polycrystal silicon layer 14 and a BPSG (boro-phospho-silicate glass) layer 16 are successively formed on a silicon substrate 10 of a P-type. Then, a photo resist layer 18 is formed on the BPSG layer 16, and patterned to have openings for separating regions 20. After that, the BPSG layer 16, the polycrystal silicon layer 14 and the gate oxide layer 12 are etched using the photo resist layer 18 as a mask, so that a surface of the silicon substrate 10 corresponding to the separating regions 20 is exposed, as shown in FIG. 1A.

Figure 1B:
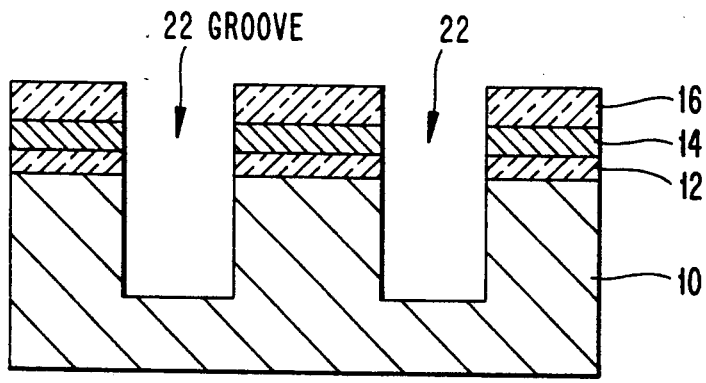

Second, after removing the photo resist layer 18, the silicon substrate 10 is etched using the BPSG layer 16 as a mask to provide grooves 22, as shown in FIG. 1B.

Figure 1C:
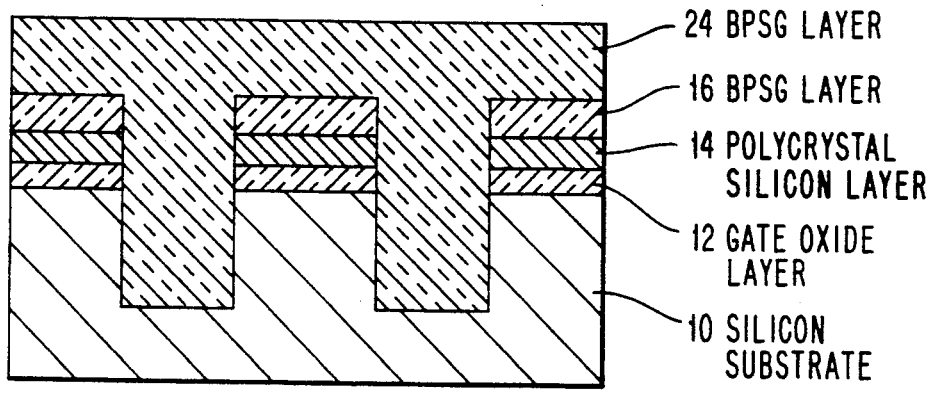

Third, a BPSG (boro-phospho-silicate glass) layer 24 is formed on a whole surface of the thus fabricated silicon substrate 10 by the CVD (chemical vapor deposition) method, and is reflowed to be flattened by a thermal treatment of 900° C., as shown in FIG. 1C.

Figure 1D:
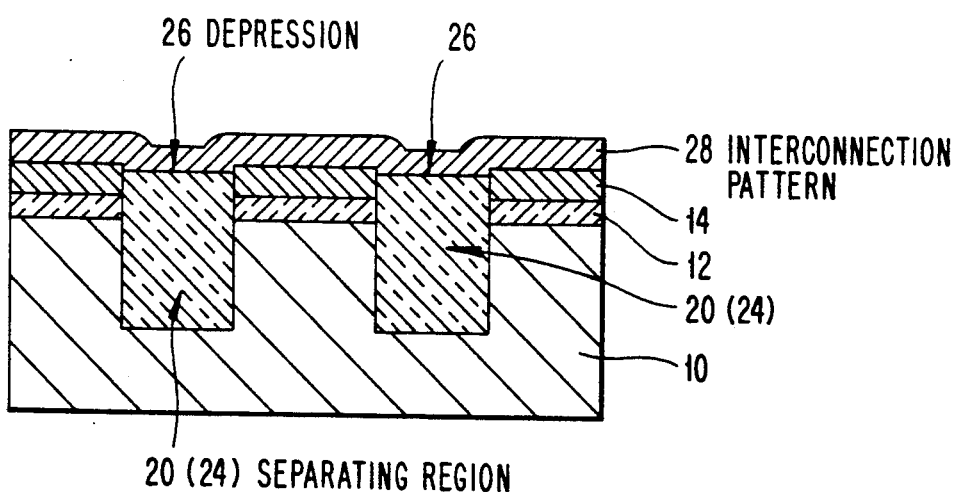

Finally, the BPSG layers 16 and 24 are etched using the polycrystal silicon layer 14 as a stopper, so that the separating regions 20 are formed in the grooves 22. Then, a tungsten silicide is formed to be patterned selectively on a surface of the structure, so that a tungsten silicide interconnection pattern 28 is formed, as shown in FIG. 1D. Thus, transistors each having a poly-cide gate electrode which is composed of the polycrystal silicon layer 14 and the silicide interconnection pattern 28 are fabricated to be separated by the separating grooves 24, wherein the silicide interconnection pattern 28 is in self-alignment with the polycrystal silicon layer 14. In this process, depressions 26 are formed on surfaces of the separating regions 20, because the etching of the BPSG layers 16 and 24 is difficult to be controlled.

According to the conventional semiconductor device, however, there is a disadvantage in that the silicon substrate 10 may be exposed at an inner surface of the grooves 22, when the BPSG layers 16 and 24 are etched. That is, the BPSG layer 24 is etched down to a level under the surface level of the gate oxide layer 12, because control of etching depth is not precisely carried out. Therefore, a short circuit may occur between the silicon substrate 10 and the silicide interconnection pattern 28, as the result, and reliability of the semiconductor device is decreased to lower yield.

Figure 2A:
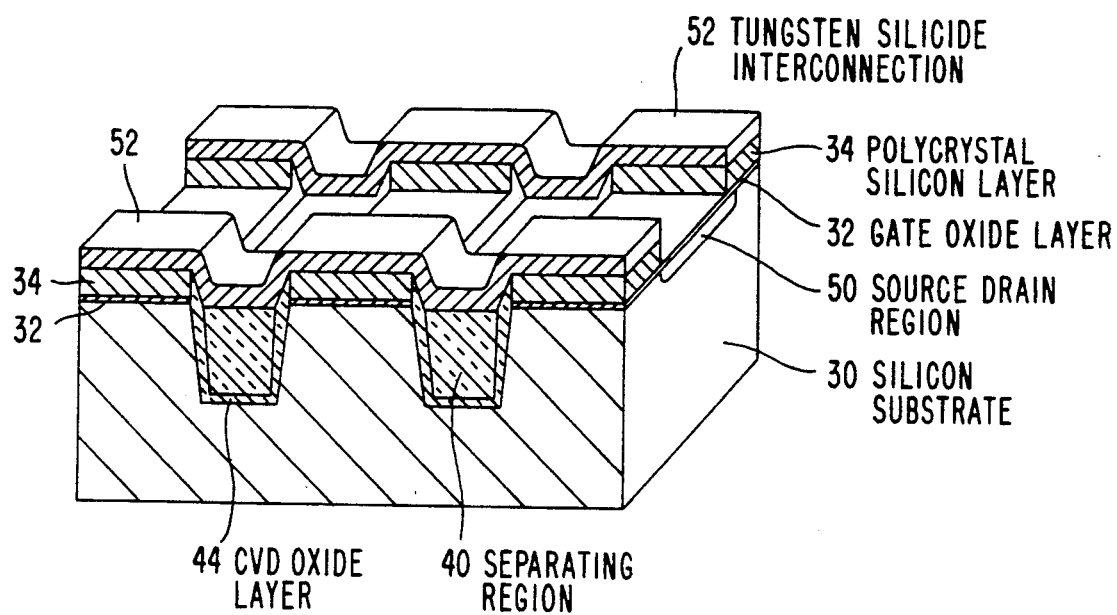
FIGS. 2A and 2B are a perspective view and an equivalent electric circuit of a semiconductor device of a preferred embodiment according to the invention.
Figure 2B:
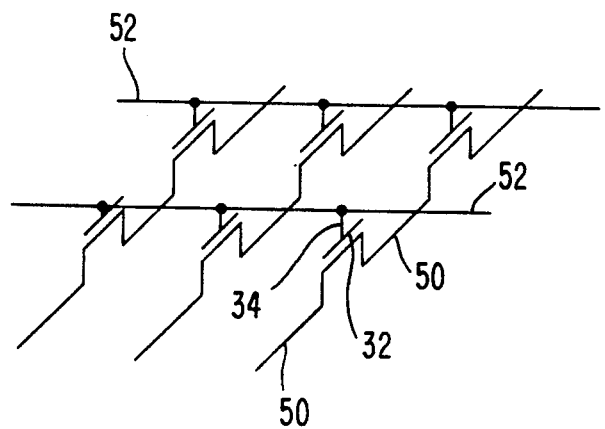

Next, a semiconductor device of a preferred embodiment according to the invention will be explained in FIGS. 2A and 2B.

The semiconductor device includes a silicon oxide layer 32 provided on a silicon substrate 30, a polycrystal layer 34 selectively provided on the silicon oxide layer 32, and a tungsten silicide interconnection 52 provided on the polycrystal layer 34. The polycrystal layer 34 and the tungsten silicide interconnection 52 provide a poly-cide gate electrode, and a source drain region 50 is provided in the upper region of the substrate 30 between the adjacent poly-cide gate electrodes, wherein the thus fabricated transistor is isolated from the parallel connected adjacent transistor by the separating grooves 40. Thus, a short circuit between the silicon substrate 30 and the interconnection 52 is avoided by a CVD oxide layer 44 of the groove 40 having an etching rate lower than the BPSG layer 46 thereof to be explained in detail later.

This semiconductor device will be fabricated by a method as shown in FIGS. 3A to 3F.

Figure 3A:
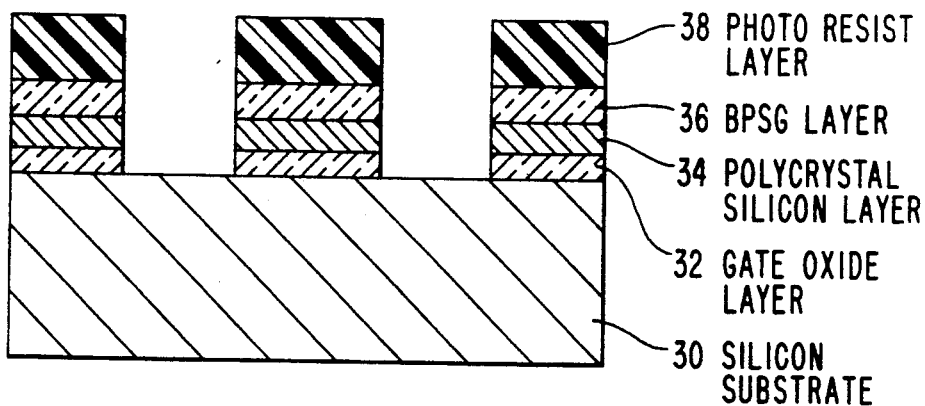
FIGS. 3A to 3F are schematic cross-sectional views showing a fabricating method of a semiconductor device in the preferred embodiment according to the invention.

First, a gate oxide layer 32 having a thickness of 10 to 25 nm is formed on a silicon substrate 30 of a P-type. Then, a polycrystal silicon layer 34 having a thickness of 100 to 150 nm and a BPSG (boro-phospho-silicate glass) layer 36 having a thickness of 200 to 300 nm are formed on a surface of the gate oxide layer 32 provided on the silicon substrate 30. Then, a photo resist layer 38 is formed on the BPSG layer 36, and patterned to provide openings having widths of 0.4 to 0.6 μm for separating regions 40, which will be explained later. After that, the BPSG layer 36, the polycrystal silicon layer 34 and the gate oxide layer 32 are etched by anisotropic etching using the patterned photo resist layer 38 as a mask, so that a surface of the silicon substrate 30 corresponding to the separating regions 40 is exposed, as shown in FIG. 3A.

Figure 3B:
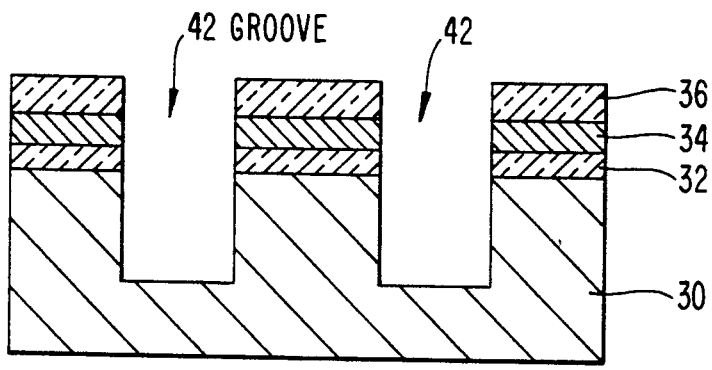

Second, after removing the photo resist layer 38, the silicon substrate 30 is etched using the BPSG layer 36 as a mask to provide grooves 42 having depths of 0.5 to 1.5 μm, as shown in FIG. 3B.

Figure 3C:
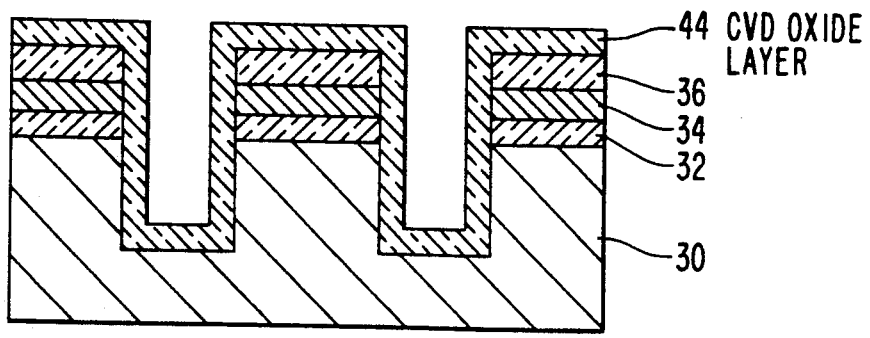

Third, a non-doped silicon oxide layer (hereinafter referred to as the "CVD oxide layer") 44 having a thickness of 100 to 200 nm is formed on a whole surface of the structure, as shown in FIG. 3C.

Figure 3D:
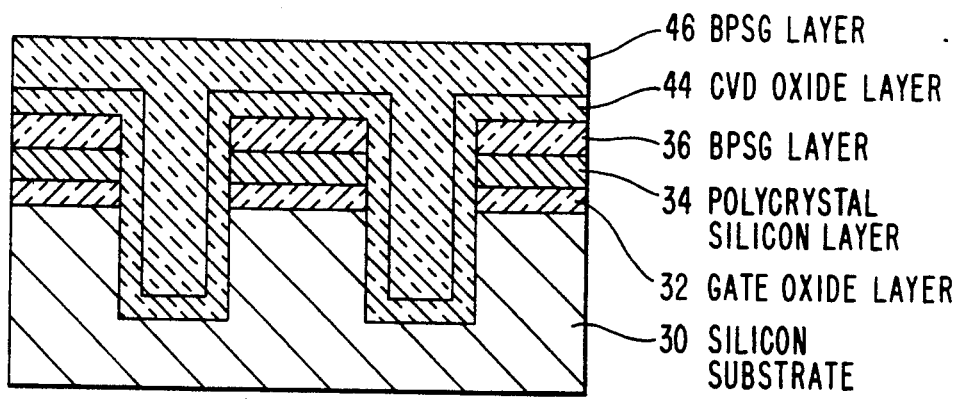

Fourth, a BPSG (boro-phospho-silicate glass) layer 46 having a etching rate 50% higher than that of the CVD oxide layer 44 is formed on a whole surface of the structure to have a thickness of 1.0 to 2.0 μm, and the BPSG layer 46 is reflowed by a thermal treatment of 850° to 950° C., so that the grooves 42 are filled up with the BPSG layer 46, as shown in FIG. 3D. At the same time, a surface of the BPSG layer 46 is flattened.

Figure 3E:
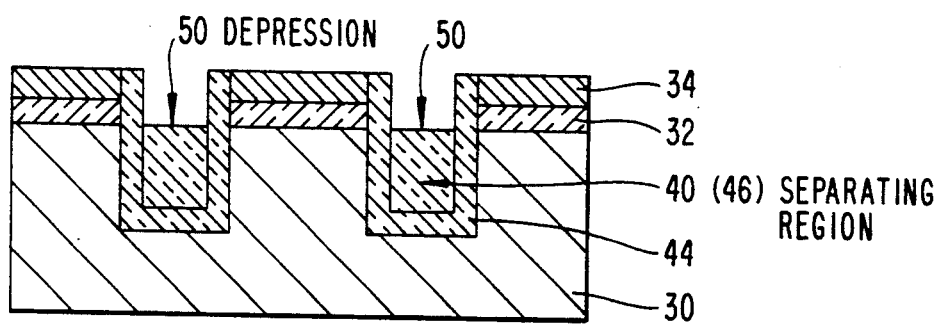

Fifth, the BPSG layer 46, the CVD oxide layer 44 and the BPSG layer 36 are etched using the polycrystal silicon layer 34 as a stopper, so that the separating regions 40 are formed in the grooves 42, as shown in FIG. 3E. In this process, it is preferable that a surface of the BPSG layer 46 becomes to be the same level as a surface of the polycrystal silicon layer 34. In fact, however, the BPSG layer 46 is etched to a level under the surface level of the polycrystal silicon layer 34, because control of the etching depth is difficult. As the result, depressions 50 are formed on the surface of the BPSG layer 46. On the other hand, the CVD oxide layer 44 is etched to a level approximately equal to the surface of the polycrystal silicon layer 34, so that an inner surface of the silicon substrate 30 is shielded by the CVD oxide layer 44.

Figure 3F:
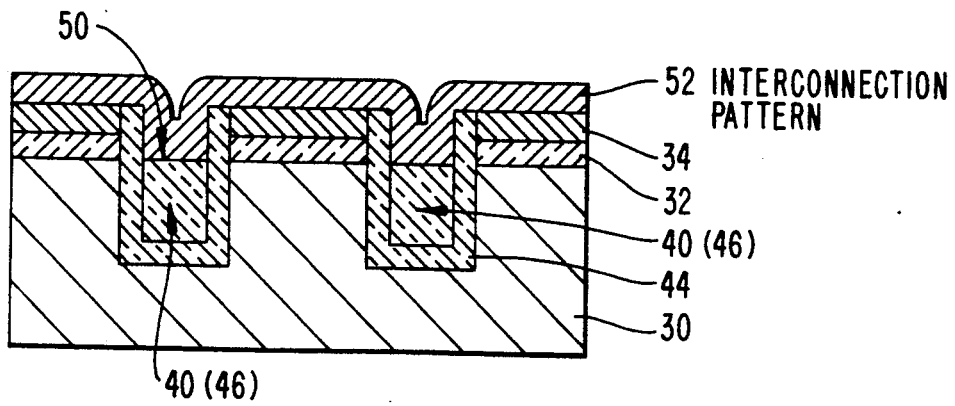

Finally, a conductive layer, such as a tungsten silicide, is formed on a whole surface of the structure, and is removed selectively, so that an interconnection pattern 52 is formed thereon, as shown in FIG. 3F. Thus, transistors each having a polycide gate electrode which is composed of the polycrystal silicon layer 34 and the silicide pattern 52 formed therewith by self alignment are fabricated.

In the preferred embodiment, even if etching rates of the CVD oxide layer 44 and the BPSG layer 46 are equal, the CVD oxide layer 44 is positioned between the silicon substrate 30 and the BPSG layer 46, so that diffusion of boron and phosphorus from the BPSG layer 46 to the silicon substrate 30 is restrained. Therefore, the separating regions 40 separate adjacent devices sufficiently, and a threshold voltage of the transistor is stabilized. A silicon nitride layer may be used for an insulator instead of the CVD oxide layer 44. In this case, it is between that a thin oxide film is formed between the inner surface of the grooves 42 and the silicon nitride layer.

Although the invention has been described with respect to specific embodiments for complete and clear disclosure, the appended claims are not thus limited and alternative constructions may occur to one skilled in the art which fairly fall within the basic teachings herein set forth.

What is claimed is:

1. A method for fabricating a semiconductor device, comprising the steps of:

forming a gate insulation film, a polycrystal silicon film and a first insulation film successively over a semiconductor substrate;

etching said gate insulation film, said polycrystal silicon film and said first insulation film at a region under which a device separation region is to be provided;

etching said semiconductor substrate by use of said first insulation film as a mask, thereby providing a groove for said device separation region;

providing second and third insulating films to be filled into said groove;

etching said first to third insulation films by use of said polycrystal silicon film as a stopper to have said second and third insulation films remain in said groove; and providing a conductive interconnection on said polycrystal silicon film.

2. A method for fabricating a semiconductor device according to claim 1, wherein:

the step of etching said second and third insulation films includes etching said third insulation film by an etching rate faster than that of said second insulation film.

3. A method for fabricating a semiconductor device according to claim 1, wherein:

the step of providing said second insulation film includes providing non-doped silicon oxide; and the step of providing said third insulation film includes providing BPSG (boro-phospho-silicate glass).

4. A method for fabricating a semiconductor device according to claim 1, wherein:

the step of providing said second insulation film includes providing silicon nitride; and the step of providing said third insulation film includes providing BPSG (boro-phospho-silicate glass).

* * * * *